US006999910B2

(12) United States Patent
Koford et al.

(10) Patent No.: US 6,999,910 B2
(45) Date of Patent: Feb. 14, 2006

(54) METHOD AND APPARATUS FOR IMPLEMENTING A METAMETHODOLOGY

(75) Inventors: James S. Koford, San Jose, CA (US); Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 629 days.

(21) Appl. No.: 10/015,194

(22) Filed: Nov. 20, 2001

(65) Prior Publication Data

US 2003/0097241 A1 May 22, 2003

(51) Int. Cl.
*G06G 7/48* (2006.01)

(52) U.S. Cl. .............................. 703/13; 703/14; 716/10
(58) Field of Classification Search .................. 703/13, 703/14; 716/10–12; 714/39
See application file for complete search history.

(56) References Cited

U.S. PATENT DOCUMENTS

| | | | |
|---|---|---|---|
| 5,222,030 A | | 6/1993 | Dangelo et al. |
| 5,553,002 A | | 9/1996 | Dangelo et al. |
| 5,625,565 A | * | 4/1997 | Van Dyke ....................... 716/1 |
| 6,026,226 A | * | 2/2000 | Heile et al. .................... 716/12 |
| 6,253,358 B1 | | 6/2001 | Takahashi |
| 6,269,467 B1 | | 7/2001 | Chang et al. |
| 6,574,778 B1 | | 6/2003 | Chang et al. |
| 6,634,008 B1 | | 10/2003 | Dole |
| 6,678,875 B1 | | 1/2004 | Pajak et al. |
| 6,704,917 B1 | | 3/2004 | Curran et al. |
| 6,721,922 B1 | | 4/2004 | Walters et al. |
| 6,742,165 B1 | | 5/2004 | Lev et al. |
| 6,834,380 B1 | * | 12/2004 | Khazei ........................ 716/10 |
| 2003/0097241 A1 | | 5/2003 | Koford et al. |
| 2004/0025119 A1 | | 2/2004 | Hamlin |

OTHER PUBLICATIONS

"A rule based VLSI process flow validation system with macroscopic process simulation", IEEE Transactions on semiconductor manufacturing, vol. 3, No. 4, Nov. 1990, oages 239–246—Author(s)—Funakoshi et al.
"Rapid Chip Management System"; filed Nov. 20, 2002; U.S. Appl. No. 10/301,182—Author(s)—Daniel M. Weed.
Simplify Programmable–Logic–IP Integration—Author(s)—Cravotta, Robert.
Altera Casts Spotlight On IP Integration Tool—Author(s)—Souza, Crista.

* cited by examiner

*Primary Examiner*—Albert W. Paladini
(74) *Attorney, Agent, or Firm*—Suiter West Swantz PC LLC

(57) ABSTRACT

The present invention is directed to a comprehensive design flow system. A system and method are provided that provide a comprehensive system to introduce a metamethodology that integrates EDA design tools into a manageable and predictable design flow. A method of designing an integrated circuit may include accessing a design utility operating on an information handling system, displaying a dynamic template on a display device of an information handling system, wherein the dynamic template implements at least two symbols displayable on a display device, in which the at least two symbols each correspond to a respective EDA tool, and arranging the at least two symbols displayed on the display device. The at least two symbols are arranged to indicate an interrelationship of the EDA tools in a design process of an integrated circuit.

7 Claims, 7 Drawing Sheets

METHOD AND APPARATUS FOR IMPLEMENTING A METAMETHODOLOGY

CROSS REFERENCE TO RELATED APPLICATIONS

The present application hereby incorporates the following United Stated Patent Applications by reference in their entirety:

| Attorney Docket Number | P.N./Express Mail Label Number | Filing Date |
|---|---|---|
| 09842335 | | Apr. 25, 2001 |
| 10021414 | EV 013 245 395 US | Oct. 30, 2001 |
| 10021619 | EV 013 245 404 US | Oct. 30, 2001 |
| 10021696 | EV 013 245 418 US | Oct. 30, 2001 |

FIELD OF THE INVENTION

The present invention generally relates to the field of product design, and particularly to method and apparatus for implementing a metamethodology in integrated circuit (IC) design.

BACKGROUND OF THE INVENTION

Integrated circuits have become a necessary part of everyday modern society. From cell phones and computers, to household appliances and automobiles, a wide range of integrated circuits are utilized to provide a broad range of functionality. To provide this functionality, integrated circuits may need to be specialized to have the functions necessary to achieve the desired results. Additionally, more and more functions are being included within each integrated circuit.

However, this has resulted in a level of design complexity previously unimagined. For example, to achieve the functions desired, multiple vendors may be used to provide Electronic Design Automation (EDA) software tools. The variety of such tools is supplied from a plurality of sources; this results in compatibility and management issues.

Further, to provide the desired product range, differing projects may require different methodologies. For instance, cost issues, the number of features to be included, and performance considerations all dictate the parameters desired in a chip by a consumer. Designing complex chips has become so ubiquitous and so pervasive that the provision of a "one size fits all" IC is unlikely as the functions desired in implementations continue to expand.

Moreover EDA tool vendors are often "behind the curve" in the development of the tools needed to perform current designs. EDA tool designers need to receive feedback from users of the tools in order to correct and improve the tool designs. For instance, due to the nature of efficient tool design, a new EDA tool is typically built, and then utilized over several feedback cycles. By the time the tool matures, designers and other elements of the process may be a generation further along, and therefore require new EDA tools, which are just entering the feedback cycle.

The level of detail involved with the integrated circuit design process may further complicate a designer's tasks. Previously, to even begin addressing the level of complexity encountered, problems were broken down into sub-problems and tools and procedures were designed to address each sub-problem. However, existing tools were often unable to address problems encountered between fixes, and hastily-written tools were prepared to "patch" the problems. The result has been an exploding collection of software tools, tool interfaces and procedures from various sources, each striving to cope with an ever-changing requirements landscape stemming from design projects of exponentially increasing complexity.

Therefore, it is desirable to produce a comprehensive system that manages design flows and procedures, as well as the computers and software required to implement the flows and procedures.

SUMMARY OF THE INVENTION

Accordingly, the present invention is directed to a comprehensive design flow system. A system and method are provided that provide a comprehensive system to introduce a Metamethodology that integrates EDA design tools into a manageable and predictable design flow for achieving on-time production system IC design results that meet customer specifications and budgets.

In a first aspect of the present invention, a system for designing an integrated circuit includes a design utility, EDA tools, one or more dynamic template(s) and one or more static template(s). The design utility is suitable for providing a user interface to enable utilization of EDA tools. The EDA tools are configured to implement at least one function in a process for designing an integrated circuit (IC). Since the EDA tools are supplied from a number of sources external to the design utility, they are treated as components in the design flow system.

A dynamic template implements at least two symbols displayable on a display device on the user computer, wherein the symbols correspond to EDA tools accessible by the design utility, the symbols arrangeable on the display by an administrator of the design system to indicate an interrelationship of the EDA tools in a design process; the dynamic template(s) then "guide" users of the system in the complex design flow. In a similar fashion, the static template(s) implement fixed structures of a design process indicated by the dynamic template(s). In this fashion, a single comprehensive system may manage many different kinds of design processes (i.e., flows); the particular flow, system structures and EDA tools used are specified by the templates involved. In each case, the comprehensive system remains the same—this is the power of Metamethodology.

In a second aspect of the present invention, a system for designing an integrated circuit includes one or more primary user computer(s) and zero or more secondary user computer(s), plus zero or more large server computer(s) communicatively coupled to a network. The user computers include a design navigator suitable for providing a user interface to enable utilization of EDA tools, a project coordinator suitable for acting as an administrative interface and command-and-control module, at least two EDA tools configured to implement at least one function in a process for designing an integrated circuit (IC) and one or more dynamic template(s). The dynamic templates implement at least two symbols displayable on a display device on the user computer, wherein the at least two symbols each correspond to respective EDA tools accessible by the primary design navigator, the symbols having been arranged on the display by an administrator computer to indicate an interrelationship of the EDA tools in a design process. The dynamic templates operate in a hierarchical fashion—that is, higher-level dynamic templates present graphical symbols that when selected open lower-level dynamic templates. In this fashion, extremely complex procedures can be modeled with relatively simple template displays at any hierarchical level.

In a third aspect of the present invention, a method of designing an integrated circuit includes accessing a design utility operating on an information handling system, displaying a dynamic template on a display device of an information handling system, wherein the dynamic template implements at least two symbols displayable on a display device, in which the at least two symbols each correspond to a respective EDA tool, and arranging the at least two symbols displayed on the display device. The at least two symbols are arranged to indicate an interrelationship of the EDA tools in a design process of an integrated circuit.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
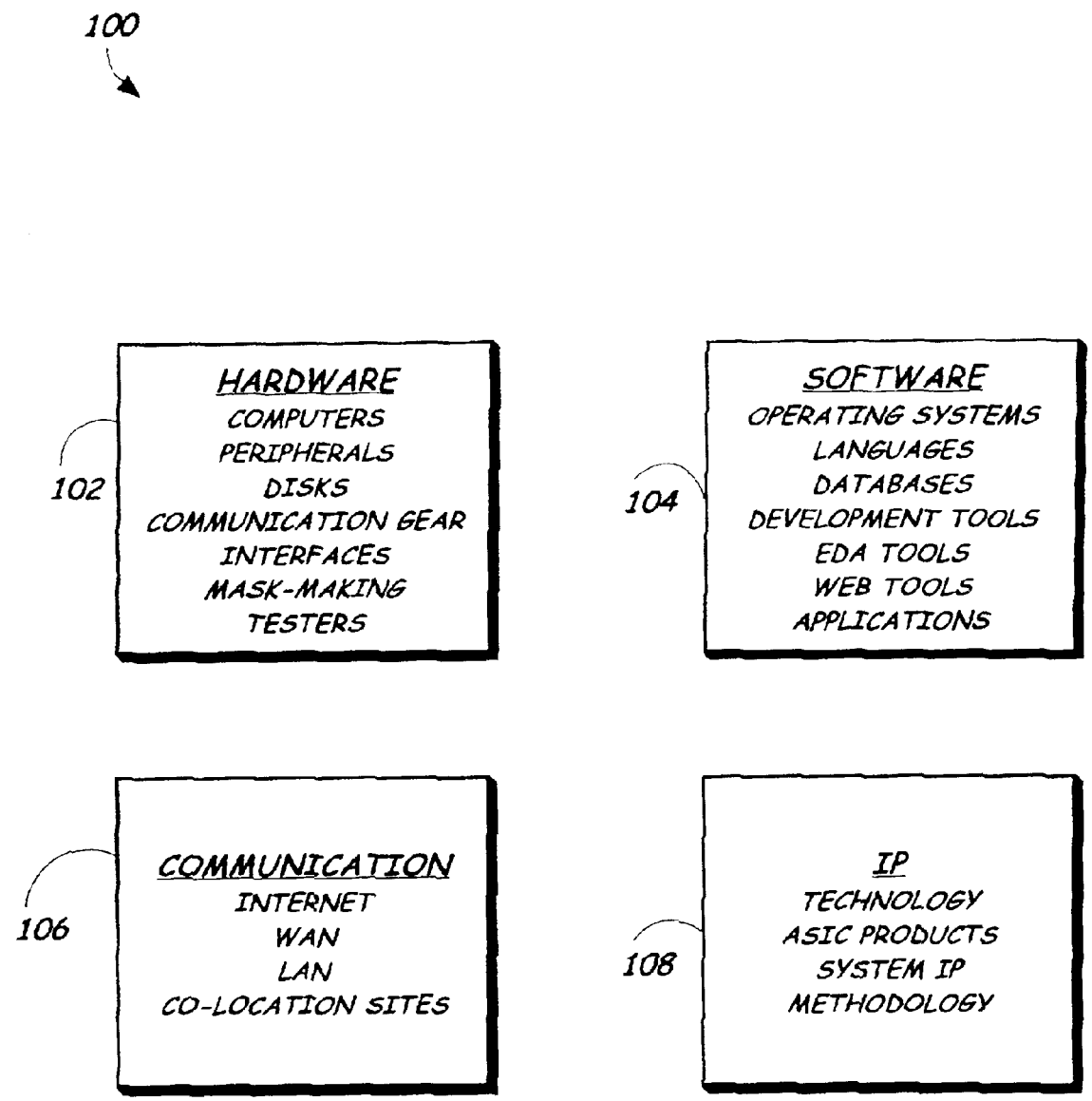
FIG. 1 is a block diagram of an exemplary embodiment of the present invention wherein items includable in a design utility are shown.

Reference will now be made in detail to the presently preferred embodiments of the invention, examples of which are illustrated in the accompanying drawings.

Referring generally now to FIGS. 1 through 5, exemplary embodiments of the present invention are shown. A fundamental problem resolved by the present invention is the ability to provide a wide range of targeted products, by a wide range of designers to a variety of customers. For example, the present invention may provide a system to achieve actual variable semiconductor products, for example, application specific integrated circuits (ASICS), application specified standardized products (ASSPs), and the like, as well as a whole range of other kinds of products, each having different implications for how these sophisticated and complex design elements are driven.

For example, a variable population of designers is generally utilized to drive the system to design the products, from expert level to beginner, and specifically trained versus generally trained kinds of designers. Furthermore, a manufacturer may encounter a myriad of customers, each having different requirements and expectations. Thus, to be effective, a design system must accommodate a variable population of designers (as to skill or specialized knowledge) working on a wide range of products whose design requirement vary extensively.

By utilizing the present invention, a general environment is provided which is capable of comprehending this extreme variation in a coherent, rule-based, definable form that is still traceable. To approach this many-bodied problem with its enormous complexity in its most general form, a method and apparatus is provided to allow defining of the kinds of variabilities previously mentioned, as well as other variabilities, in what for present discussion purposes will be referred to as a metamethodology.

A methodology may include a sequence of procedures applied to solve a particular problem in a given area. Additionally, if the problems in that area are numerous, many different methodologies may be necessary for solving the problem. Thus, a "metamethodology" may refer to a collection of methods that are common to all possible methodologies within that area, and the principles according to which that collection is organized and manipulated. In this way, a manufacturer may accommodate a variety of different customers, numerous different designers, a multiplicity of different third-party and internally-developed software, hardware, processes and the like, all kinds of different target processes and all types of different target products in one unified framework.

The present invention provides a unified development process, including inception, elaboration, construction and transition. Iterative processes may use case-driven development. Further, a unified modeling language (UML) may be provided as a standard software modeling languages that documents and tests a plan, and maps well into an object-oriented implementation.

The present invention allows an abstraction of the design process, similar to an abstraction in programming from assembler code to high-level languages. In an exemplary embodiment of the present invention, the present invention may be implemented in two aspects. First, a design utility may be provided which is the implementation of metamethodology, and the overall system, which for discussion purposes will be referred to as "metastream," which includes third-party tools, and the like.

A design utility may be provided as an implementation of metamethodology in an overall design environment. The design utility may call upon, but typically does not include, applications such as design tools, database systems, and the like. Applications, such as design tools, database system, and other utilities as contemplated by a person of ordinary skill in the art, are components of the system. Thus, the overall system, i.e. metastream, that may be implemented as software operable on an information handling system, includes both the design utility and the components, i.e. applications, design tools, and the like, that it calls.

Metastream, as an implementation of metamethodology, manages the design process to achieve desired objectives. Thus, the metastream may implement flows, enforce discipline of designers toward desired objectives, increase communication and promote design integrity. The metastream includes a comprehensive software utility that introduces the metamethodology, and may integrate EDA tools, such as manufacturer and third-party tools.

Therefore, the metastream may revolutionize design productivity by employing a metamethodology focused on design flow supported by EDA tools. The metastream provides the standard unified user interface that integrates the required functions. For example, the metastream may provide current design status accessible by a user, manage complexity by employing a common design discipline, track and archive projects through production, achieve user and customer support, and may measure production results by schedules, budgets, and the like. Since these functions are common to all design projects, they fit within the definition of metamethodology.

Referring now to FIG. 1, an exemplary embodiment of the present invention is shown wherein items includable in a design utility are shown. A design utility 100 may include a variety of items, such as hardware 102, software 104, communication 106 and IP 108, to implement a design structure of the present invention. Hardware 102 may include computer, peripherals, disks, communication devices, interface, mask making, testers, and the like. Software 104 may include operating systems, languages, databases, development tools, EDA tools, Web tools, applications, and the like. Additionally, communication 106 for the design utility may be implemented through a local area network (LAN), wide area network (WAN), Internet, co-location sites, and the like. Further, IP 108 issues of the design utility 100 may include technology, both in-house, contract provider, outsource, and the like, as well as system IP and methodology. Thus, the design utility 100 is confronted with a variety of issues.

Figure 2:
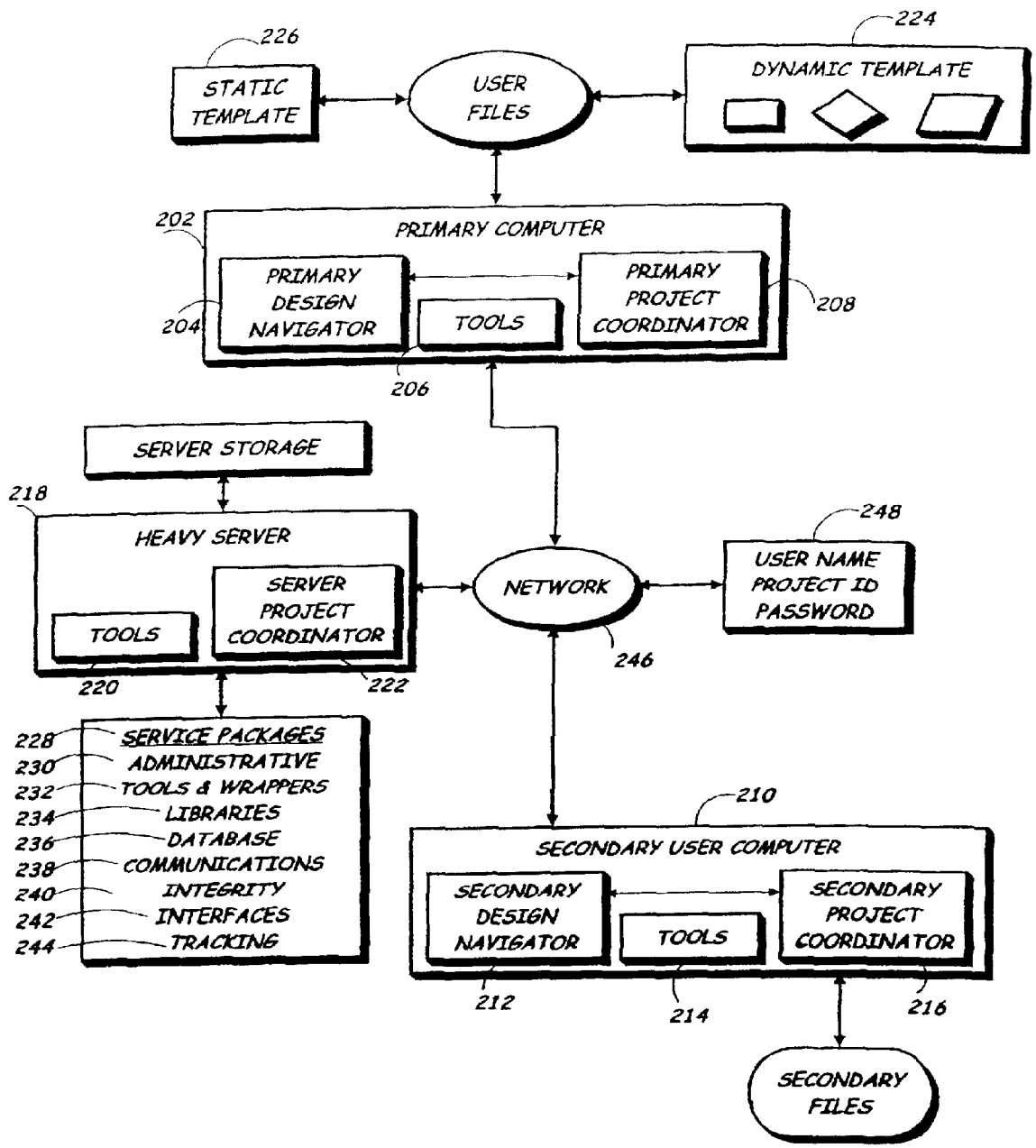
FIG. 2 is a block diagram illustrating an exemplary embodiment of the present invention wherein an architecture operable to embody a metamethodology is shown.

Referring now to FIG. 2, an exemplary embodiment of the present invention is shown wherein an architecture operable to embody a metamethodology is shown. Previous design implementations suffered from an inability to predict, based on rigid structures, what was needed to perform a variety of operations to reach a targeted design. Although a basic static template maybe utilized, it is simply a collection of named files, which were usually filled in by a question & answer type program, known as a "wizard". Thus, it is only able to provide the design utility with fixed information, such as process technology, product information, and the like.

However, the design process may contain numerous decisions. Thus, these decisions may not be included in a previous static templates, and thus would not be provided. Therefore, a mechanism is needed that enabled a flexible decision process.

In an aspect of the present invention, a dynamic template is provided to implement a procedure or sequence of steps. The dynamic template may implement a "firm" program that gives considerable latitude to a user, but may still require milestones and signoffs to be traversed in order for the program to be completed. This is in distinction to a "soft program" in which the user is given a distant goal, but no immediate requirements, or to a "hard" program, in which the user is constrained at every step. For instance, hard programs are the equivalent of computer programs, and are thus to constraining to be acceptable for most human designers.

In this way, as a firm program, the dynamic template may still promote completion of the project at various stages, and promote timely and efficient utilization of a production schedule. The dynamic template thus implements a flow chart for a specific methodology. A type of "wizard" program is utilized for the creation of dynamic templates in a user-friendly manner.

For instance, an engineer may be working on a project. As the project progresses, decisions are made. Additionally, the engineer may want to do something differently, perhaps, than planned at the beginning. Further, there may be certain EDA tools that should not be utilized, because if the particular tool is used, delay, damage, and the like may occur. These various changes were previously unable to be provided in a comprehensive design system, or were made in an undisciplined way, that often made such changes dangerous to the outcome of the project.

Dynamic templates may give guidance to a user and even pressure the user, such as to complete stages of the process, and the like. Yet, a dynamic template also gives a user considerable latitude. Additionally, it may be preferable to assert increasing amounts of pressure on a user, such as reminders regarding status, and the like, of increasing levels so that both "soft" and "hard" deadlines may be enforced and regulated.

Thus, the present invention may be utilized as a form of guidance, according to a rule-based methodology. Additionally, it may be desirable to ensure progress and completion of tasks, such as by utilizing a sign-off at various stages and milestones, and the like. Further, the software may implement these milestones so that the project is not allowed to proceed until certain problems and stages are addressed and completed, thereby limiting the magnitude of problems encountered later. For instance, this may all be controlled by a set of static and dynamic templates that instruct the metastream design utility how to manage the flow of the design process. In this fashion, nothing about the specific design flow is "built-into the design utility." Rather, it comes from the design utility reading and interpreting the templates. This property of "template driven behavior" is what makes the design utilities function a proper implementation of metamethodology.

Further, the present invention may provide a comprehensive audit trail. Tracking in integrated circuit design projects and measuring results of components is especially critical in the establishment of an audit trail for two reasons: one is in guiding the overall evolution of the flow itself, and also, an audit trail may guide the subsequent design of future improvements to a metamethodology. Thus, content and the format of audit trail formulation components are of the utmost importance. Discussion of a heuristic method of the present invention in relation to an audit trail will be undertaken later in the detailed description.

Referring now to FIG. 2, an exemplary embodiment of the present invention is shown wherein an architecture suitable for employing a metamethodology is shown. First, a primary computer 202 may be provided, which may also be referred to as a primary computer. The user computer 202 may include a primary design navigator 204, tools 206, and a primary project coordinator 208.

Additionally, a secondary user computer 210 may be provided. For example, the secondary user computer 210 may be placed at another remote location that is working on this project. The secondary user computer 210 may include a secondary design navigator 212 tools 214, and a secondary project coordinator 216.

Further, for computation intensive tasks, a "heavy" server 218 may be provided. For example, a heavy server 218 may include a plurality of processors, such as 30 to 50 processors, so that large amounts of data may be processed. The heavy server 218 may also include server tools 220 and a server project coordinator 222.

Each computer may have a set of EDA tools 206, 214 & 220 respectively. EDA tools are components to metastream. Preferably, metastream is transparent to EDA tools. For example, a third party tool may be switched without requiring a change in the structure and/or configuration of the metastream. Preferable, the tool file implementations are compliant with OS standards and each tool returns its completion state to the metastream. Thus, the capability, for instance, of unhooking one third-party component and hooking in another thirty-party component, if it does the job better, is provided without disequilibrating all of the complex relationships that have been set up in the flow processes. Thus, it provides isolation, which is currently unavailable.

The present invention thus lifts the entire semiconductor design process to a new level of abstraction, which becomes familiar to the user. For example, if a new EDA tool was implemented, rather than suddenly have the user engage in a maze of twisted passages of configuration and implementation, the way in which the tool is described, documented and interfaced will not change. Further, a common script may be provided so that modules, tools and functions are implemented in a common manner that may become familiar to a user of the system. In short, even though the tools (i.e. "components") integrated the metastream design utility must be changed, the design utility still presents, familiar, consistent interface to the user.

Around the tools 206, 214 & 220, a wrapper may be provided, so that when the system 200 enters and exits a tool, the system is informed. Thus, the wrapper may be thought of as a gateway interface to a design tool.

Additionally, dynamic 224 and static templates 226 may be provided. Shown in the dynamic template 224 are flowchart symbols to indicate the implementation of a design flow of the present invention. For example, a technology may be set-up with a static template, which points to one or more dynamic templates to implement the flow. In this way, dynamic templates implement the flow, static templates, essentially, may implement the structure. Static templates may indicate what tools to use, what libraries to use, the relevant technology, and the like.

Additionally, the templates of the present invention may implement an underlying logic for guiding the filling in of the template, whether the template is static or dynamic. In other words, an interactive utility may be provided, which directs the process of filling in either a static or a dynamic template. Thus, a user may interact with a design flowchart, which may be similar to hypertext, having targeted flowchart symbols implementing a corresponding design function. Further, the flowchart symbols may be used for navigation. Moreover, the system may be configured to include an automated, heuristic, self-modifying behavior.

The design navigators 204 & 216 may be provided as a primary graphical user interface (GUI). Preferably, one design navigator process is provided per user. The user may be identified by name, password, project ID, and the like. The user may interact with a type of "hyper flow chart" that is specified by a dynamic template 224. Thus, a user may navigate by interacting with chart symbols, and may determine status of a project at all times. It may be preferable for the scope of the design navigator to cover project inception to production, and own any design tracking files so that a complete user tool may be provided. It should also be apparent that a design navigator may also be provided on the server 218 without departing from the spirit and scope of the present invention.

The project coordinators 208 & 212 may act as a design utility configuration and control supervisor, to coordinate tools, files and network communications, thereby acting as an administrative interface. The project coordinators 208 & 212 facilitate system-wide functions, such as access control, load balancing, file backup and security, and the like as contemplated by a person of ordinary skill in the art. One project coordinator 208 & 212 is preferably provided per design utility computer 202 & 210. Further, each project may use a different set of coordinators, and each coordinator may simultaneously handle many different projects, thereby providing overlapping sets.

Additionally, service packages 228 may be provided, the service packages 228 containing subsystems needed by a design utility, such as administrative 230, tools and wrappers 232, libraries 234, databases 236, communications 238, system integrity utilities 240, interface 242, tracking 244, and the like. The service packages 228 may be maintained independently of the design utility as needed. To provide redundancy, service packages 228 may be located at a plurality of computer sites, such as all computer sites in a system.

Further, it may be desirable to adopt a tool/flow strategy in which the service packages 228 contain the subsystems that are needed. However, unlike previous implementations, EDA tools are now components, and are not the primary function provider. Further, the service packages 228 may be made transparent to both the interface and the actual process.

When implementing an EDA tool, it may be preferable for the EDA tool to obtain control of the host system that is running it. Because EDA tools may be very complex pieces of software, it may be undesirable to have other programs or user intervention other than the processes needed to implement the tool at that time. Once that tool is done, then control may be passed again to the design utility. Thus, in this example, if the tool returned control to the operating system in an unscheduled manner, a determination may be made that the tool crashed. Thus, the EDA tool may "own" that computer and its screen while performing the desired function, but if the EDA tool does not return control properly, the design utility is able to record that fact, and if possible, take corrective action.

Further, security of the design system of the present invention is an important consideration. Since network connections may be employed in the implementation of the system, it is desirable to ensure the integrity of those connections. Thus, all links initially are assumed to be insecure. Thus, all secure transmissions are encrypted, and access obtained, via "permissions", via password, encryption, and the like. Permissions may be secured locally, globally, and the like. Further, storage may be secured through encryption, and any stored data replicated remotely to ensure data integrity. For instance, a sufficient redundancy and encryption may be provided to guarantee the necessary level of security and robustness.

The architecture of the present invention may support a variety of hosting options. For example, a distributed design may be employed in which no single-point of failure will interrupt system operation. Thus, a site of a primary computer may be shifted, and the status of the design flow and files available to all sites. Additionally, multiple host computers, design groups, and locations may be employed by the present invention.

Communication within the architecture and between architectures may utilize a network 246, such as Internet, wide area network (WAN), local area network (LAN), and the like, without departing from the spirit and scope of the present invention. It may also be preferable to utilize a permission system 248 to control access to both individual computers and the system as a whole.

Additionally, dynamic load balancing may be utilized by an architecture of the present invention. For example, job queues may be maintained, and through prediction and/or monitoring of the systems and software, a computer may be selected that is most likely to have resources available. For example, some EDA projects are very "batchy" and require very little user intervention, while others are very interactive. Ideally, the interactive EDA projects are implemented on a computer that has a design navigator on it, and a non-interactive process may be performed on an unmanned server, such as the heavy server 218 in FIG. 2.

Initially, a project administrator may be utilized to "set-up an account", such as by specifying a project ID, passwords and templates. Wizards may then be initiated to prepare static and dynamic templates. Preferably, the wizard programs are designed to be used by product development engineers, and do not need a detailed knowledge of programming to implement. This may be accomplished by creating dynamic templates by a flowchart drawing wizard program. Preferably, configuration of the dynamic templates includes extensive checking, for conflicts and the like, under a rule-based paradigm. Further, static templates may be prepared by prompting a user to answer specific questions, add additional information, and the like.

Figure 3:
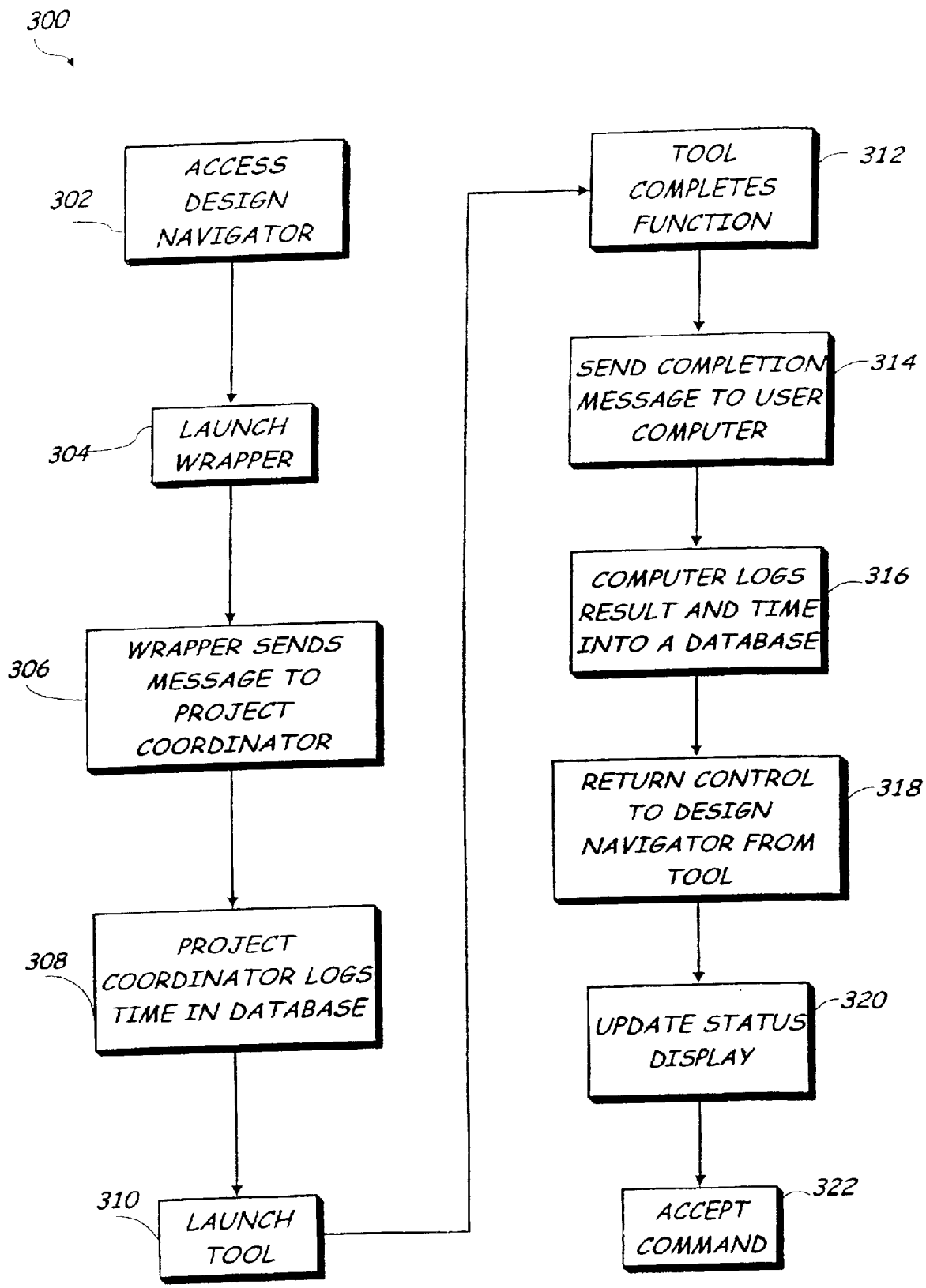
FIG. 3 is a flow diagram depicting an exemplary method of the present invention wherein a design navigator implements a design tool.

Referring now to FIG. 3, an exemplary method 300 of the present invention is shown wherein a design navigator implements a design tool. In the project coordinator, when a user clicks on a design navigator icon 302, the tool itself is not launched, but first a scripted "wrapper" is launched 304. The wrapper sends a message to the project coordinator system, supplying a project ID, tool to be launched, and the like 306. The project coordinator logs date, time, project ID, user, tool name, files, and the like in a database accessible by the project coordinator 308.

The tool is launched 310, completes the desired function 312, and returns to the wrapper, which sends a completion message to the user's computer 314. The computer logs a completion code, date, time, and the like into a database 316 in order to provide current status of the design project. Control is then returned to the design navigator 318, which communicates with the PC to update the status displays 320. At this point, a user may launch a next command, and the like 322.

Figure 4A:
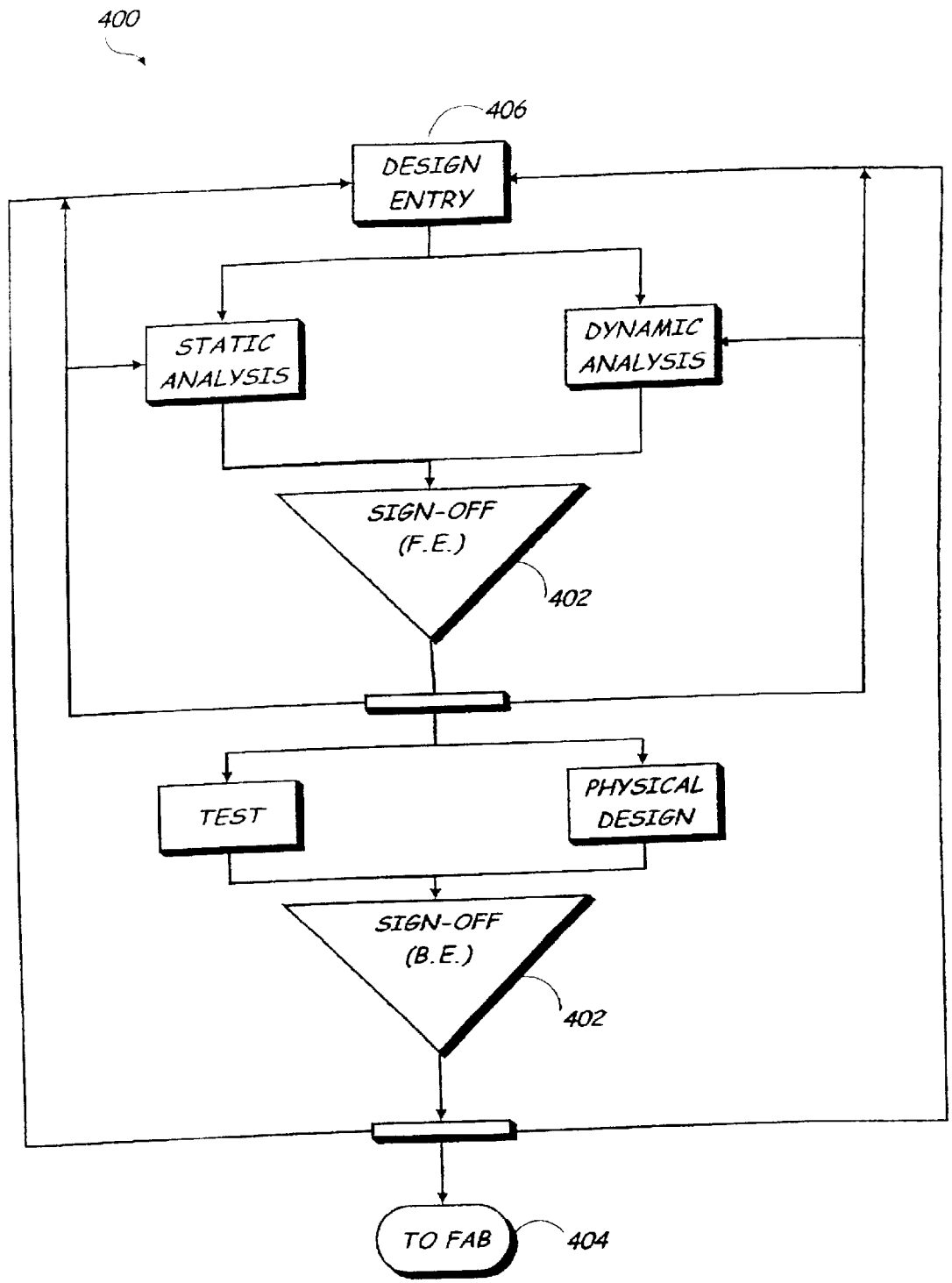
FIG. 4A is an illustration of an exemplary embodiment of the present invention wherein an outer level of a design navigator screen is shown.
Figure 4B:
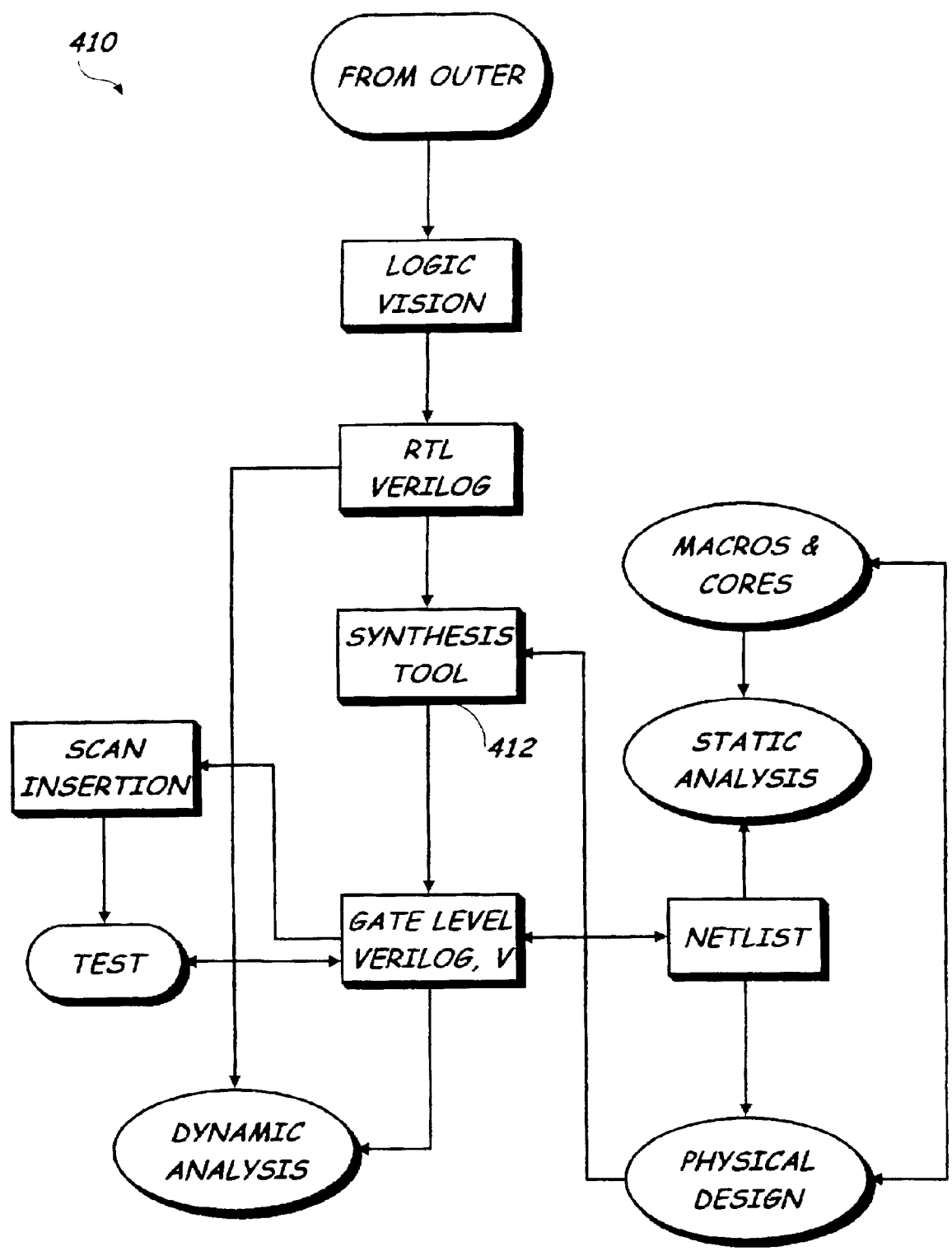
FIG. 4B is an illustration of an exemplary embodiment of the present invention wherein a design entry screen of a hierarchy of a design navigator is show.
Figure 4C:
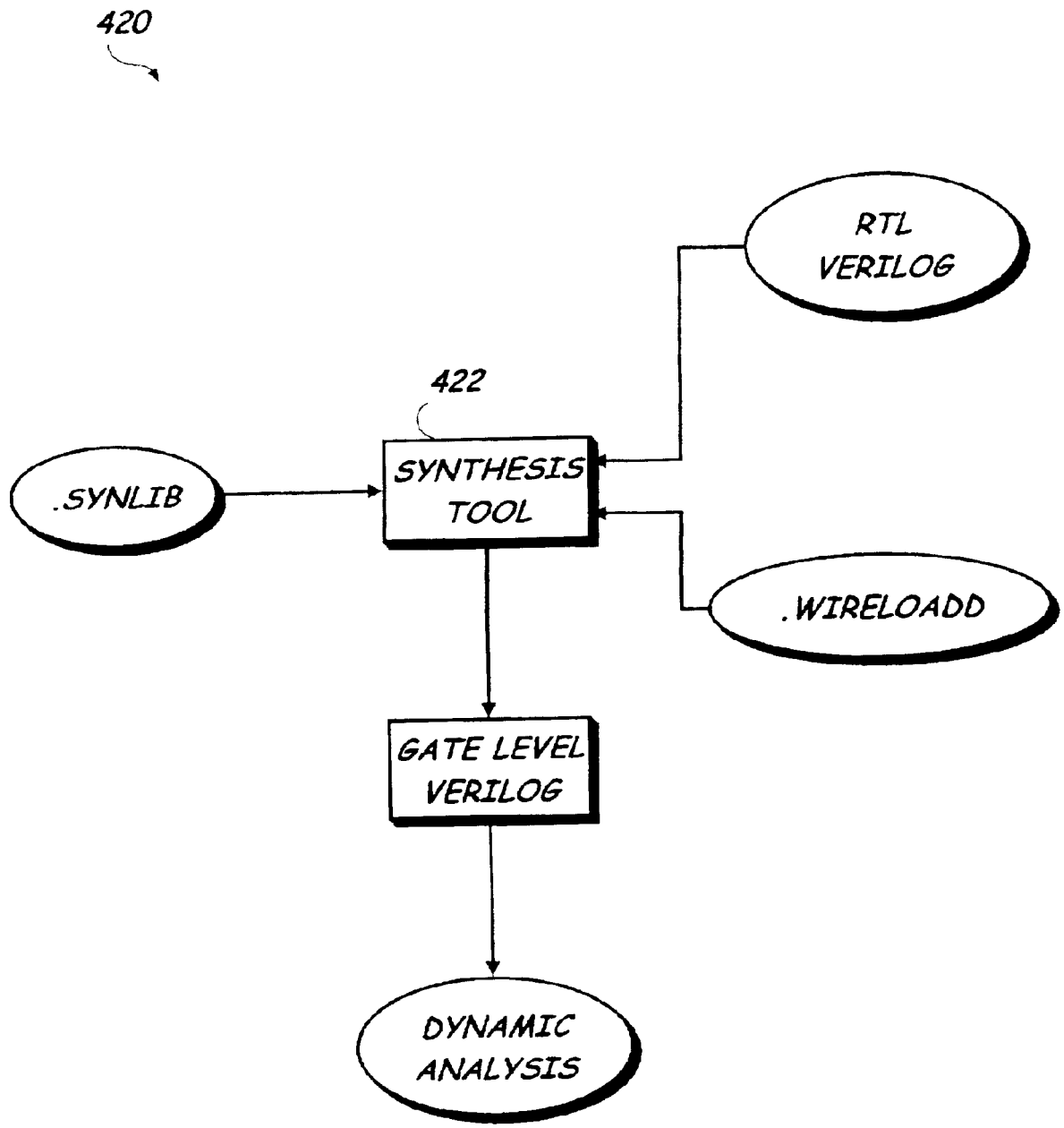
FIG. 4C is an illustration of an exemplary embodiment of the present invention wherein a design tool screen as accessed by a design navigator is shown.

Referring generally now to FIGS. 4A through 4C, an exemplary navigation through an implementation of the present invention is shown. For example, as shown in FIG. 4A, an embodiment of the present invention is shown wherein an exemplary design navigator, outer level is shown. The design navigator 400 includes a plurality of symbols implemented in a flow chart design corresponding to the production process. Further, "sign-offs" 402 are included at milestones in the productions process so that the various stages are completed in order, and that problems occurring in initial stages of the design process are not magnified as the process continues.

In the present example, FIG. 4A shows the highest level of the flow for the current process. Colors and shapes may be utilized to indicate function and status, respectively. For example, green arrows may indicate completion of the task, yellow may mean that the process has started, while a red arrow may indicate that the task was not begun, and the like as contemplated by a person of ordinary skill in the art. In this way, the status of a current project may be determined quickly and accurately.

Additionally, the flow chart symbols may be utilized to access the process, such as by electing an fabrication symbol 404 to access a fabrication screen. For example, a user may select a design entry symbol 406 and access a design entry screen, as shown in the display 410 of information depicted in FIG. 4B.

A user, interacting with the display 410 in FIG. 4B, may select a synthesis tool, such as by clicking on a synthesis tool symbol 412 utilizing a cursor control device. The synthesis tool symbol 412 brings up a tool environment for the synthesis tool, as shown in FIG. 4C. A display 420 of the tool environment depicted in FIG. 4C indicates the various database, files, and the like used by the tool 422. To initiate the tool, a user may select the tool, at which time the system implements a tool utilization process. For instance, as stated before, when a tool 422 is implemented, the tool itself is not launched, but rather a wrapper is launched. Thus, the system may log date, time, project, and the like into a file indicating status. Then the tool 422 is launched, and now control of the system is turned over to the tool 422.

When the tool finishes, the results may be recorded. If the tool does not return a result, the system marks the tool 422 as crashed. In this way, an EDA vendor may be informed, so that prompt correction is obtained. For example, the system may automatically inform a vendor, through email and the like, of the failure of a tool and the reasons therefore. Further, the tool may return reasons for crashing without departing from the spirit and scope of the present invention.

After, the tool exit and completion is logged in a file, the user may be returned to the design navigator 400, as shown in FIG. 4A, and the status as indicated by the flow is updated.

Further, completion of tasks and status may be achieved as a user progresses through levels in the flow, and in this way, promotes completion of tasks in an orderly manner. For instance, suppose the arrows in FIG. 4C are all green, showing that a user completed all those tasks. The user may then be returned to the screen shown in FIG. 4B, in which different tasks may be selected and completed until all those arrows are green, and the like as contemplated by a person of ordinary skill in the art. Additionally, it should be apparent that some aspects of the design utility may be implemented in a browser format.

Figure 5:
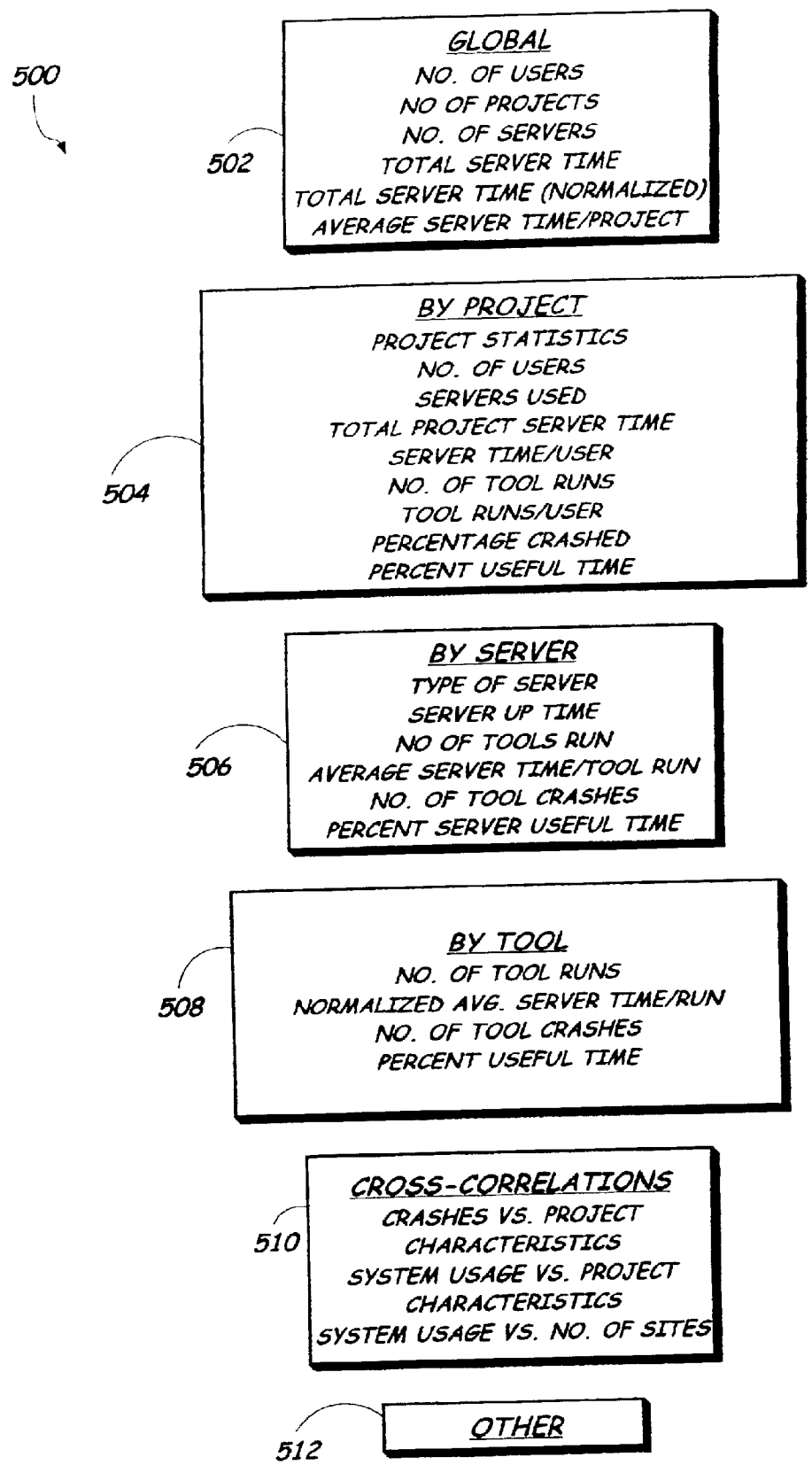
FIG. 5 is an illustration of an embodiment of the present invention wherein reports creatable by the present invention are shown.

To provide detailed analysis on a variety of different factors, targeted reports may be provided. For example, as shown in FIG. 5, an exemplary screen as displayed on a display device for a user is shown wherein reports may be generated. Reports may be generated both globally 502, by project 504, by server 506, by tool 508, by cross-correlation 510, and other 512 values as contemplated by a person of ordinary skill in the art without departing from the spirit and scope thereof, such as locating specific individuals working on aspects of the design, and the like.

In additional embodiment of the present invention, heuristic feedback may be employed to provide increased flexibility in the architecture and implementation. The notion of heuristic feedback may be directed at the problem of analyzing conditions and state at each stage in a complex flow, and then optimally, ideally or preferentially defining feedback patterns that carry state and process information back to earlier stages in a rule-based and consistent format. Thus, the architecture will in addition to permitting the system as a whole to function more efficiently without thrashing, (i.e. excessive seeking, hunting, and the like), permit the system to optimize the overall design process itself.

The notion of heuristic feedback, in general, may describe a grouping of formalisms in terms which may be used to describe an entire flow having this degree of variability desired by a user, on the one hand, and the ability to initiate feedback processes and control coherently.

For example, a dynamic template may be modified dynamically, such as by making changes to the actual implementation of the template based on monitored results from previous usage. In another example, a warning may be output to a user when encountering a situation previously monitored by the system that had undesirable results.

Further, in a flow as complex as integrated circuit design, there may be a large number of different points back to which the process could return. However, if the process goes back too far, the possibility of incurring a great deal of redundant or worthless effort may be encountered. Additionally, if the process does not go back far enough, the desired improvement may not be achieved. However, by utilizing the present invention, the inputs and outputs of the tools themselves, which may be parametric and often very complex in and of themselves, may provide a way of optimally feeding back results in a type of "self-improving" process.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, such as the computers and server architecture shown in FIG. 2. Until required, the set of instructions may be stored in another readable memory device, for example in a hard disk drive or in a removable memory such as an optical disc for utilization in a CD-ROM drive, a floppy disk for utilization in a floppy disk drive, a floppy/optical disc for utilization in a floppy/optical drive, or a personal computer memory card for utilization in a personal computer card slot.

Further, the set of instructions can be stored in the memory of an information handling system and transmitted over a local area network or a wide area network, such as the Internet, when desired by the user. Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

Although the present invention has described a semiconductor design process, it should be any design flow may be utilized by the present invention without departing from the spirit and scope thereof, such as to coordinate business engagement models with a design flow and the like as contemplated by a person of ordinary skill in the art.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the method and apparatus for implementing a metamethodology of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system for designing an integrated circuit, comprising:
   a first user computer communicatively coupled to a network, including
      a first design navigator, the first design navigator suitable for providing a user interface to enable utilization of EDA tools;
      a first project coordinator, the first project coordinator suitable for acting as an administrative interface;
      at least two EDA tools, wherein the EDA tools are configured to implement at least one function in a process for designing an integrated circuit (IC); and
      a dynamic template, wherein the dynamic template implements at least two symbols displayable on a display device on the user computer, wherein the at least two symbols each correspond to a respective EDA tools accessible by the first design navigator, the symbols arrangeable on the display by a user of the user computer to indicate an interrelationship of the EDA tools in a design process; and
   a second user computer communicatively coupled to the network, including
      a second design navigator, the second design navigator suitable for providing a user interface to enable utilization of EDA tools;
      a second project coordinator, the second project coordinator suitable for acting as an administrative interface;
      at least two EDA tools, wherein the EDA tools are configured to implement at least one function in a process for designing an integrated circuit (IC); and
      a dynamic template, wherein the dynamic template implements at least two symbols displayable on a display device on the user computer, wherein the at least two symbols each correspond to a respective EDA tools accessible by the second design navigator, the symbols arrangeable on the display by a user of the user computer to indicate an interrelationship of the EDA tools in a design process.

2. The system as described in claim 1, wherein the interrelationship of the symbols of the dynamic template is a flow.

3. The system as described in claim 1, wherein the project coordinator is suitable for providing at least one of tool-usage logging, access control, load balancing, file backup and security.

4. The system as described in claim 1, wherein at least one dynamic template includes at least one of a milestone and sign-off.

5. The system as described in claim 1, wherein each EDA tool is embedded within a wrapper, the wrapper suitable for always indicating to the project coordinator (which, in turn informs the design navigator) of at least one of entry of an EDA tool and either an exit of an EDA tool or a suspension of the EDA tool operation due to a malfunction or other unexpected occurrence.

6. The sysem as described in claim 1, wherein dynamic load balancing is utilized by at least one of the primary project coordinator and the secondary or server project coordinator(s).

7. The system as described in claim 1, wherein heuristic feedback is utilized so that utilization of the EDA tools is monitored and utilized to configure future interrelationships on dynamic templates, new requirements for tools and procedures, and algorithmic and implementation enhancements to exiting tools and procedures.

* * * * *